(12) United States Patent
Lee et al.

(10) Patent No.: US 7,045,374 B2
(45) Date of Patent: May 16, 2006

(54) METHOD FOR MANUFACTURING SEMICONDUCTOR OPTICAL AMPLIFIER HAVING PLANAR BURIED HETEROSTRUCTURE

(75) Inventors: Dong Hun Lee, Daejeon-Shi (KR); Eun Deok Sim, Daejeon-Shi (KR); Ki Soo Kim, Jeollabuk-Do (KR); Moon Ho Park, Daejeon-Shi (KR)

(73) Assignee: Electronics and Telecommunications Research Institute, Daejeon-Shi (KR)

( * ) Notice: Subject to any disclaimer, the term of this patent is extended or adjusted under 35 U.S.C. 154(b) by 0 days.

(21) Appl. No.: 10/844,321

(22) Filed: May 13, 2004

(65) Prior Publication Data

US 2005/0084991 A1 Apr. 21, 2005

(30) Foreign Application Priority Data

Oct. 20, 2003 (KR) .................. 10-2003-0072957

(51) Int. Cl.
*H01L 21/00* (2006.01)
(52) U.S. Cl. ..................... 438/31; 438/29; 438/30; 438/32; 438/69; 385/126; 385/130; 385/131
(58) Field of Classification Search ............ 438/29, 438/30, 31, 32, 69; 385/126, 130, 131
See application file for complete search history.

(56) References Cited

U.S. PATENT DOCUMENTS

| 5,844,929 A | 12/1998 | Lealman et al. | |
| 6,162,655 A * | 12/2000 | Johnson et al. | 438/31 |
| 6,411,764 B1 * | 6/2002 | Lee | 385/131 |

(Continued)

OTHER PUBLICATIONS

N. Yoshimoto, et al.; "Polarisation-insensitive semiconductor optical amplifier gate switch with butt-jointed spot-size convertors-its uniformity"; IEE Proc.-Optoelectron., vol. 146, No. 1; Feb. 1999; pp. 71-76.

(Continued)

*Primary Examiner*—Bradley K. Smith
*Assistant Examiner*—Douglas Menz
(74) *Attorney, Agent, or Firm*—Mayer, Brown, Rowe & Maw LLP

(57) ABSTRACT

Provided is a method for manufacturing a planar buried semiconductor optical amplifier in which a spot size converter with a double-core structure is integrated, comprising the steps of: after growing a lower cladding layer, a lower waveguide layer and an upper cladding layer on a substrate, patterning a portion of thickness of the lower cladding layer, the lower waveguide layer and the upper cladding layer through an etching process using a dielectric layer pattern to form a lower waveguide; growing a planarization layer on the etched portions of the lower cladding layer, the lower waveguide layer and the upper cladding layer to smooth a surface; after removing the dielectric layer pattern, growing a space layer, an upper waveguide layer and a first cladding layer on the overall upper surface; patterning the first cladding layer, the upper waveguide layer and the space layer through the etching process using the dielectric layer pattern to form an upper waveguide having a horizontal taper area; after growing a first current blocking layer on the etched portions of the first cladding layer, the upper waveguide layer and the space layer of the upper waveguide, growing a second current blocking layer on the exposed portion of the first current block layer excluding the dielectric layer pattern; and after removing the dielectric layer pattern, forming a second cladding layer on the overall upper surface, and forming an electrode on the second cladding layer and the substrate, respectively.

7 Claims, 11 Drawing Sheets

U.S. PATENT DOCUMENTS 6,421,492 B1 * 7/2002 Weber .................. 385/131
6,465,269 B1 * 10/2002 Furushima .................. 438/31

OTHER PUBLICATIONS

R. Zengerle, et al.; "Low-loss beamwidth transformers on InP with reduced requirements on lithographic resolution"; J. Vac. Sci. Technol. B 11(6), Nov./Dec. 1993; American Vacuum Society; pp. 2641-2644.

J.-Y. Emery, et al,; "High performance 1.55 µm polarisation-insensitive semiconductor optical amplifier based on low-tensile-strained bulk GaInAsP"; Electronics Letters, vol. 33, No. 12; 5th Jun. 1997; pp. 1083-1084.

* cited by examiner

METHOD FOR MANUFACTURING SEMICONDUCTOR OPTICAL AMPLIFIER HAVING PLANAR BURIED HETEROSTRUCTURE

BACKGROUND

1. Field of the Invention

The present invention relates to a semiconductor optical amplifier (SOA) that amplifies and outputs incident light and, more specifically, to a method for manufacturing a semiconductor optical amplifier (SOA) having a planar buried heterostructure (PBH) in which a spot size converter (SSC) with a double-core structure is integrated.

2. Discussion of Related Art

Generally, an semiconductor optical amplifier that amplifies and outputs incident light intensity has an input unit and an output unit each having a symmetric structure, and for the semiconductor optical amplifier integrated with a spot size converter, there can be a butt joint semiconductor optical amplifier and a double-core structure semiconductor optical amplifier.

The butt joint semiconductor amplifier consists of an active waveguide region for signal gain and a passive waveguide region for converting an optical mode, in which the active waveguide and a vertical taper type passive waveguide are coupled horizontally.

The double-core structure semiconductor optical amplifier consists of an upper active waveguide and an underlying passive waveguide, in which the upper active waveguide is formed in a horizontal taper type where the width is gradually reduced, so that the efficient light coupling is derived between the underlying passive waveguide and the upper active waveguide.

FIGS. 1A and 1B illustrate a conventional semiconductor optical amplifier fabricated with the butt joint and the selective area growth (SAG).

As a planar buried heterostructure (PHB) where an active waveguide 11 and a passive waveguide 14 are formed on a substrate 10, the active waveguide 11 where an active layer 13 is formed between separated confinement heterostructure (SCH) 12 and the passive waveguide 14 where a vertical taper area 16 is formed are coupled by the butt joint.

The feature of this structure is that the passive waveguide 14 is stacked by a selective area growth (SAG) method to be a vertical taper structure, wherein the farther it is from the active waveguide 11, the thinner the passive waveguide is, whereas the bigger the size of the optical mode becomes, and with such vertical taper structure, the light coupling efficiency with the optical fiber is increased. The vertical taper structure passive waveguide 14 is connected to the active waveguide 11, which is for signal amplification, through the horizontal butt joint 15, and a current blocking layer 17 is formed near the passive waveguide 14 and the active waveguide 11 to improve the current injection characteristics.

However, in the above structure, an inner reflection at the butt joint and a light coupling loss between two waveguides can be generated according to the coupling surface structure and the regrowth condition due to the butt joint between two waveguides having different refractive indices, and a thickness and a composition of the waveguide layer is changed according to the position of a mask pattern when the passive waveguide 14 is grown using the selective area growth (SAG) method. Therefore, the regrowth condition affects the characteristics of the semiconductor optical amplifier significantly, so that a strict growth condition is required.

FIGS. 2A and 2B show a conventional semiconductor optical amplifier with a vertical double-core structure consisting of a lower waveguide and an upper waveguide in a horizontal taper form.

The above semiconductor optical amplifier has a vertical double-core structure, wherein a passive waveguide 22 and an active waveguide 23 are formed, comprising the upper active waveguide 23 for signal gain; the underlying passive waveguide 22 for amplifying the light coupling efficiency with the optical fiber; and a horizontal taper area 24 for deriving the efficient light coupling between the upper active waveguide 23 and the underlying passive waveguide 22 by gradually reducing the width of the upper active waveguide 23. In FIGS. 2A and 2B, the reference numeral 21 indicates a p-InP cladding layer, numeral 27 indicates an ohmic layer, numeral 28 indicates a dielectric layer and numeral 29 indicates an electrode.

The feature of the above structure is that the width of the end of the upper active waveguide 23 is reduced, thereby light propagating through the upper active waveguide 23 is transferred to the underlying passive waveguide 22 without any loss, and that the underlying passive waveguide 22 is thin and its refractive index is small, thereby increasing the size of the optical mode to reduce the light coupling efficiency with the optical fiber aligned at both ends. When the angle of the horizontal taper area 24 is sufficiently small and the width of the taper end is small, the optical coupling loss between the upper active waveguide 23 and the underlying passive waveguide 22 is small and the composition and the structure of the underlying passive waveguide 22 is optimized, thereby enhancing the light coupling efficiency with the optical fiber.

For blocking the current, in the above structure, the upper active waveguide 23 and the underlying passive waveguide 22 are etched, and then the upper cladding layer 21 is stacked and proton ions with high energy are implanted to form the current block layer 25. When the current blocking layer 25 is formed by the proton injection, as described above, the upper active waveguide 23 and the underlying passive waveguide 22 are vertically formed with an InP space layer therebetween, so that the high energy ion is injected into the upper active waveguide 23 and the underlying passive waveguide 22 region to incur the waveguide loss. Therefore, in order to prevent the waveguide loss, a mask pattern capable of blocking the proton injection should be used. However, in case the width of the mask pattern is larger than that of the active waveguide, the efficient current blocking is not achieved, so that there exists a difficulty in reducing the width of the mask pattern as possible. Further, a stress can be generated due to the growth difference at each plane in growing the thick p-InP cladding layer 21, caused by unnecessary planes formed during each etching process for forming the upper active waveguide 23 and the underlying passive waveguide 22, and when the stress is beyond the threshold value, there occurs a problem, such as dislocation. Due to the dislocation and the inefficient current blocking, the leakage current is generated so that the characteristics of the optical device can be degraded and the light loss in the optical mode can be derived at the interface between the active waveguide 23 and the passive waveguide 22 and the p-InP cladding layer 21.

SUMMARY OF THE INVENTION

Therefore, the present invention is directed to a method for manufacturing a planar buried type semiconductor optical amplifier capable of addressing the above drawbacks by forming an underlying passive waveguide, removing a surface step with a planarization layer, and by easily implementing a planar buried heterostructure using a current blocking layer in a double-core structure.

To achieve the foregoing, the present invention provides a method for manufacturing a planar buried type semiconductor optical amplifier, the method comprising the steps of: after growing a lower cladding layer, a lower waveguide layer and an upper cladding layer on a substrate, patterning some thickness of the lower cladding layer, the lower waveguide layer and the upper cladding layer through an etching process using a dielectric layer pattern to form a lower waveguide; growing a planarization layer on the etched portions of the lower cladding layer, the lower waveguide layer and the upper cladding layer to smooth a surface; after removing the dielectric layer pattern, growing a space layer, an upper waveguide layer and a first cladding layer on the overall upper surface; patterning the first cladding layer, the upper waveguide layer and the space layer through the etching process using the dielectric layer pattern to form an upper waveguide having a horizontal taper area; after growing a first current blocking layer on the etched portions of the first cladding layer, the upper waveguide layer and the space layer of the upper waveguide, growing a second current blocking layer on the exposed portion of the first current block layer excluding the dielectric layer pattern; and after removing the dielectric layer pattern, forming a second cladding layer on the overall upper surface, and forming an electrode on the second cladding layer and the substrate, respectively.

The etching process for forming the lower waveguide is performed by a wet etching process using an HBr-based etchant, and is performed such that some thickness of the upper cladding layer, the lower waveguide layer and the lower cladding layer below the dielectric layer pattern is side-etched.

The planarization layer is an n-InP layer, and the first current blocking layer is a p-InP layer, and the second current blocking layer is an n-InP layer.

The method further comprising the steps of: forming a p-InP layer on the second current blocking layer; and before forming the electrode, forming an ohmic layer on the second cladding layer.

DETAILED DESCRIPTION OF PREFERRED EMBODIMENTS

The preferred embodiment of the present invention will now be described with reference to the accompanying drawings.

Figure 1A:
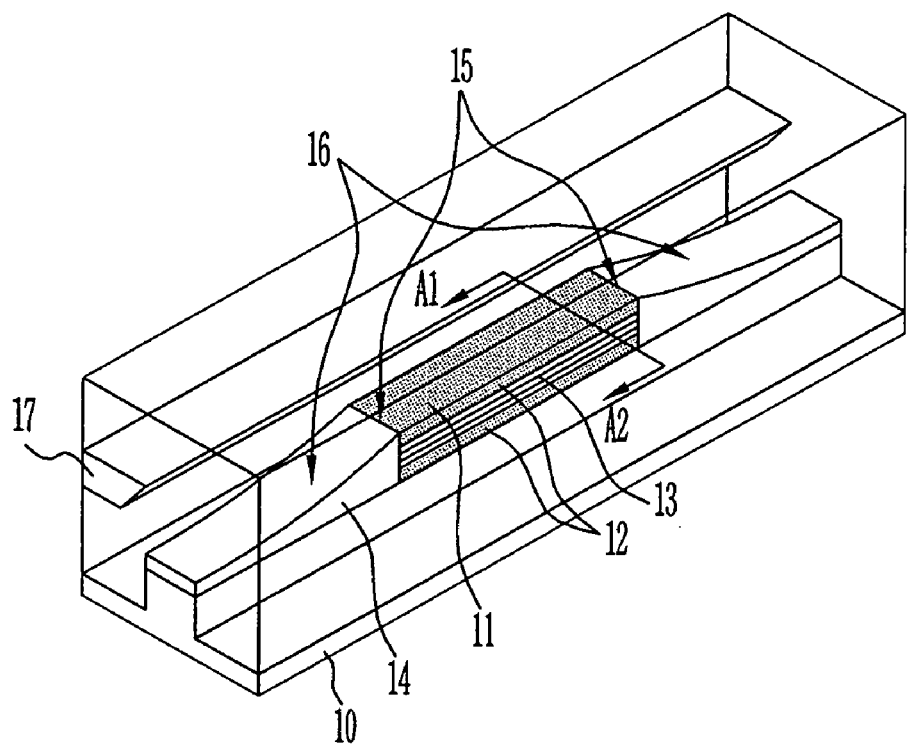
FIG. 1A is a schematic diagram for illustrating a conventional semiconductor optical amplifier having a planar buried heterostructure (PBH), integrated with a vertical taper type spot size converter.
Figure 1B:
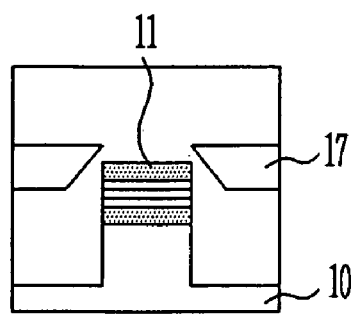
FIG. 1B is a cross sectional view taken along A1–A2 portion of FIG. 1A.
Figure 2A:
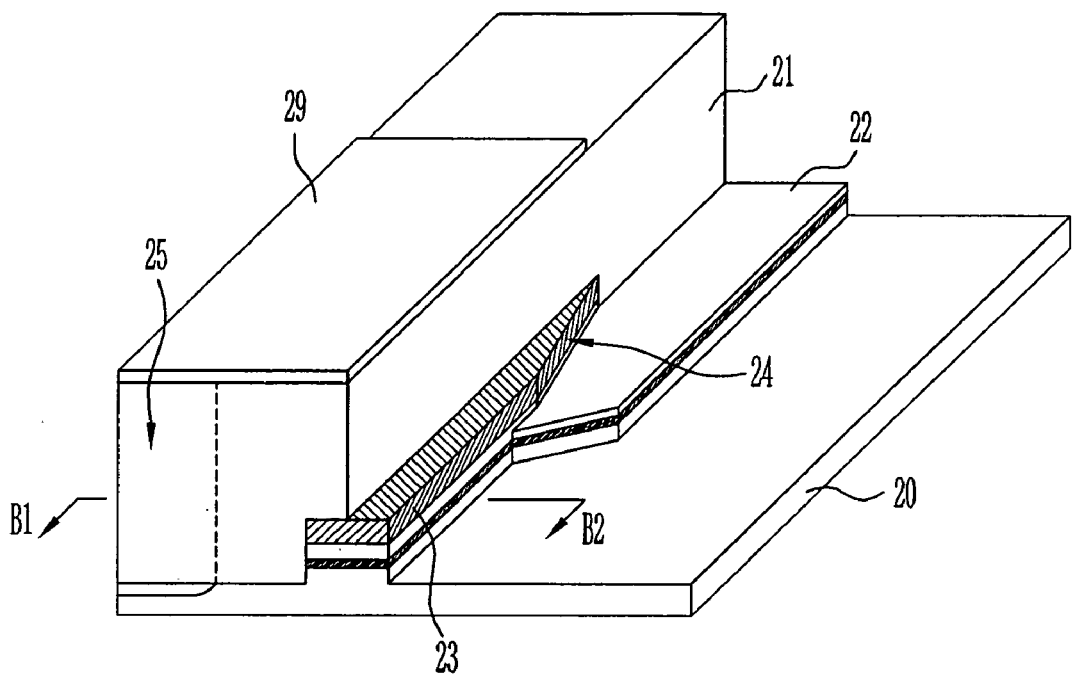
FIG. 2A is a schematic diagram for illustrating a conventional semiconductor optical amplifier having a buried ridge structure (BRS), integrated with a double-core structure spot size converter.
Figure 2B:
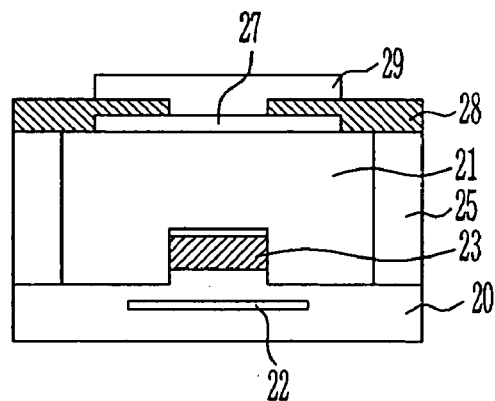
FIG. 2B is a cross sectional view taken along B1–B2 portion of FIG. 2A.
Figure 3:
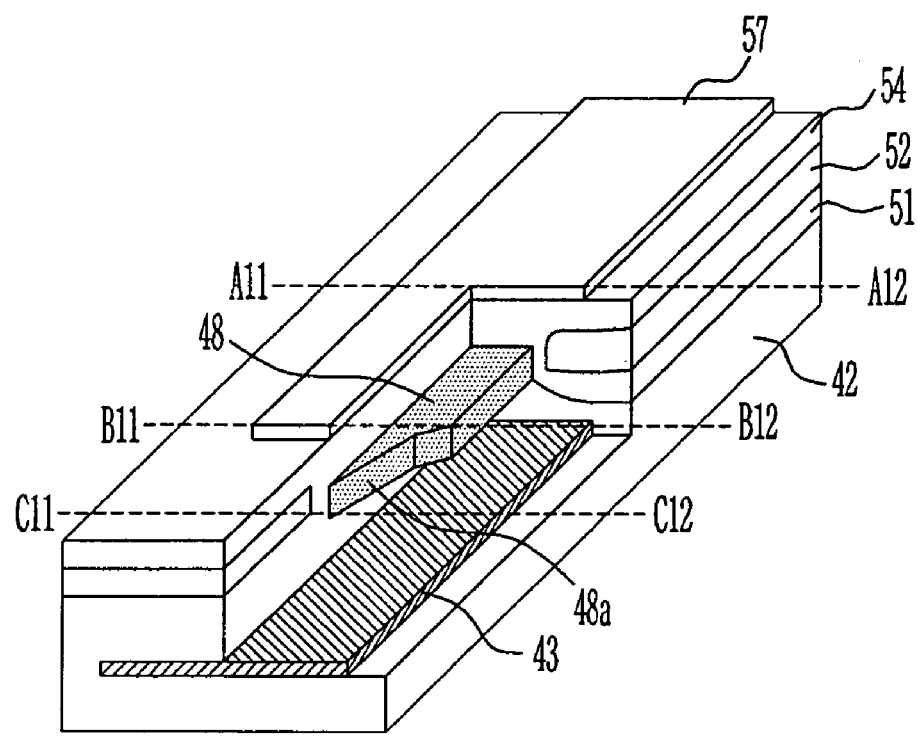
FIG. 3 is a schematic diagram for illustrating a semiconductor optical amplifier having a planar buried heterostructure, integrated with a double-core structure spot size converter according to the present invention.

FIG. 3 is a schematic diagram for illustrating a planar buried type semiconductor optical amplifier integrated with a double-core structure spot size converter according to an embodiment of the present invention.

An underlying passive waveguide 43 for increasing the size of the optical mode and an upper active waveguide 48 for amplifying the optical signal are formed on an n-InP substrate 41 in a vertical structure. The underlying passive waveguide 43 and the upper active waveguide 48 are isolated by an n-InP space layer 47 of 0.4 µm thickness. A horizontal taper area 48a where the width of the waveguide is gradually reduced is formed on the side of the upper active waveguide 48, and an n-InP current blocking layer 52 is formed on the upper active waveguide 48 and the side of the horizontal taper area 48a.

The underlying passive waveguide includes an n-InP lower cladding layer 42, an InGaAsP ($\lambda$=1.15 µm, 0.1 µm) lower waveguide layer 43 and an n-InP upper cladding layer 44, and the upper active waveguide includes the upper waveguide layer 48 made of an InGaAsP ($\lambda$=1.55 µm, 0.15 µm) active layer formed between an InGaAsP ($\lambda$=1.15 µm, 0.1 µm) SCH layer (not shown) and an SCH layer. The upper active waveguide is formed in a width of 1 µm, and the width of the horizontal taper area 48a is reduced with two steps, that is, for 50 µm length, the width is reduced from 1 µm to 0.5 µm, and for 150 µm length, the width is reduced from 0.5 µm to 0 µm.

FIGS. 4A to 4E are cross sectional view for illustrating a manufacturing process of a planar buried type semiconductor optical amplifier integrated with a double-core structure spot size converter according to the present invention.

Figure 4A:
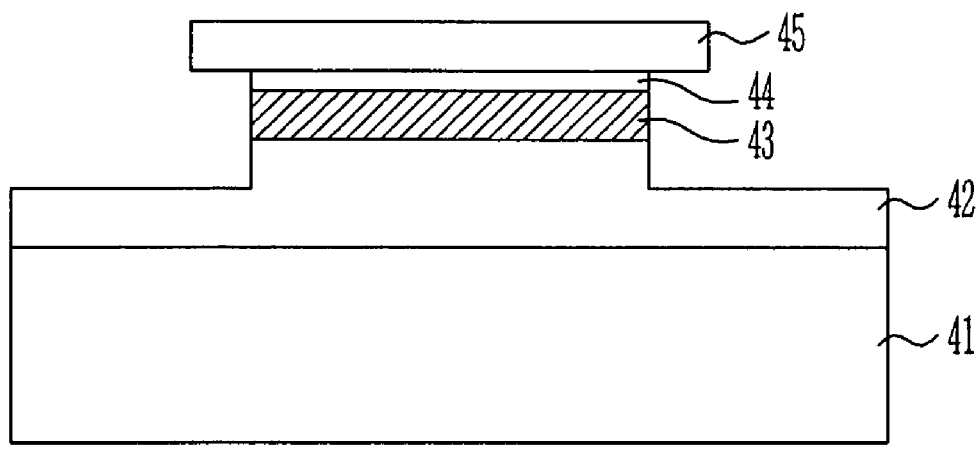
FIGS. 4A to 4E are cross sectional views for illustrating a manufacturing process of a semiconductor optical amplifier having a planar buried heterostructure, integrated with a double-core structure spot size converter according to the present invention.

Referring to FIG. 4A, the n-InP lower cladding layer 42, the underlying passive waveguide layer 43 and the thin n-InP upper cladding layer 44 are grown on the n-InP substrate 41. A SiNx layer is deposited on the n-InP upper cladding layer 44, and is patterned by a photolithography process to form a dielectric layer pattern 45 for forming the underlying passive waveguide. Some thickness of the n-InP upper cladding layer 44, the waveguide layer 43 and the n-InP lower cladding layer 42 exposed by a wet etching process using the dielectric layer pattern 45 as a mask are removed to form the underlying passive waveguide. Here, the sides of the n-InP upper cladding layer 44, the waveguide layer 43 and the n-InP lower cladding layer 42 below the dielectric layer pattern 45 are wet-etched into 0.3 μm thickness using a HBr-based etchant.

Figure 4B:
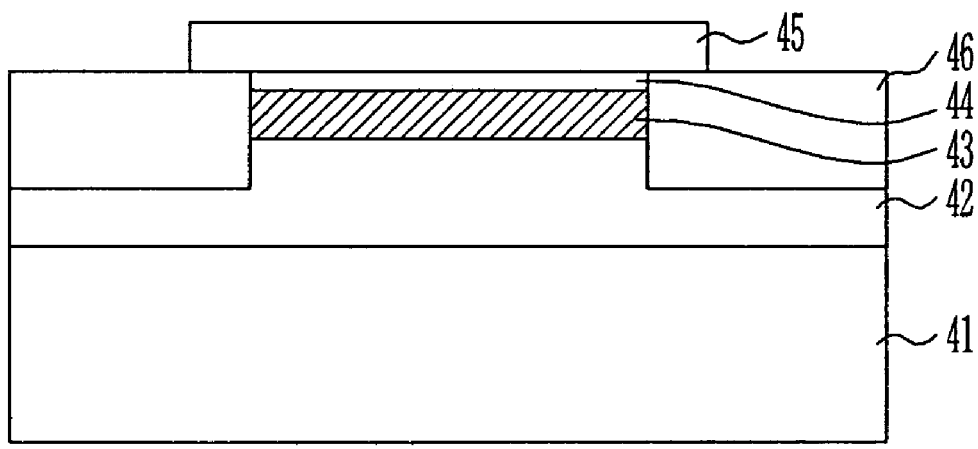

Referring to FIG. 4b, an n-InP planarization layer 46 is grown on the etched region of the n-InP upper cladding layer 44, the waveguide layer 43 and the n-InP lower cladding layer 42 to smooth the surface. The planarization step is a key process of the present invention, which is for easily implementing the planar buried structure forming the current blocking layer in manufacturing the double-core structure spot size converter, and by removing the step of the substrate surface, it can be prevented degradation or change of the characteristics of the active layer due to the stress caused by the step when the upper active waveguide layer is grown on the underlying passive waveguide.

Figure 4C:
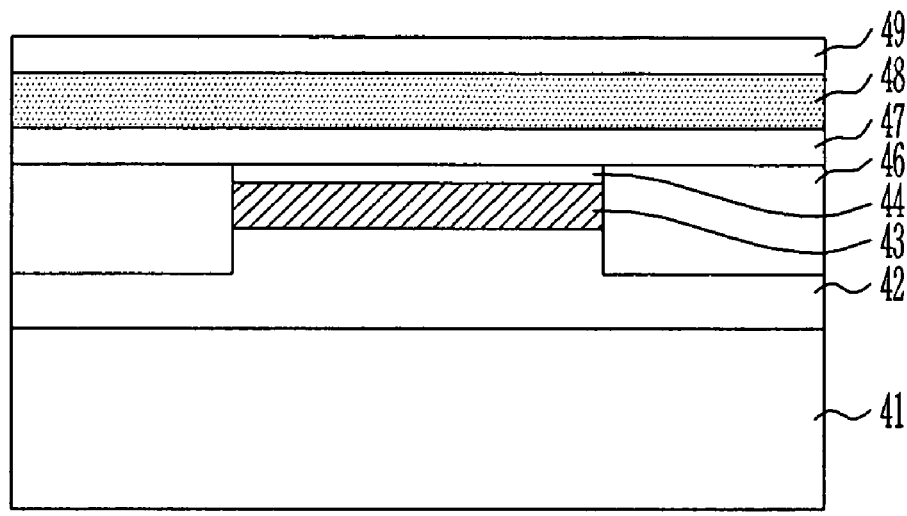

Referring to FIG. 4C, the dielectric layer pattern 45 is removed, and then the n-InP space layer 47, the upper active waveguide layer 48 and the thin p-InP layer 49 are grown on the overall planarized structure. The upper active waveguide 48 is formed as an active layer together with the SCH layer, and the portion where the horizontal taper area 48a is to be formed is larger than the width of the underlying passive waveguide layer 43. Here, the portion of the upper active waveguide layer 48 excluding the central 1 μm area is removed by the following etching process in order to form the horizontal taper area 48a, so that it does not affect the growth of the active layer.

Figure 4D:
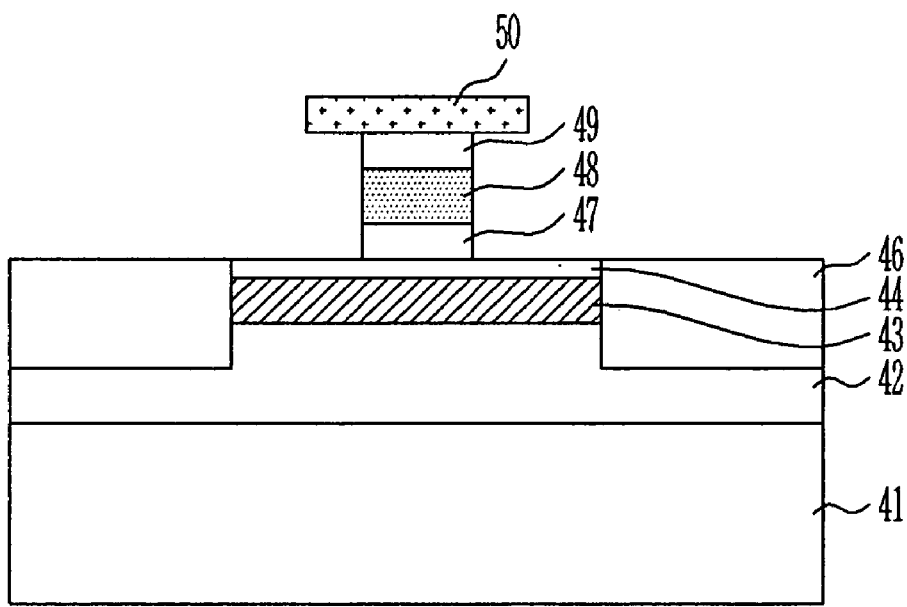

Referring to FIG. 4D, the dielectric layer such as the SiNx layer is deposited on the upper p-InP layer 49, and then a photoresist pattern (not shown) for forming the upper active waveguide is formed using the lithography process. The dielectric layer is formed by the plasma enhanced chemical vapor deposition (PECVD) method.

The dielectric layer is patterned by a magnetically enhanced RIE (MERIE) process using the photoresist pattern as a mask, so that the upper active waveguide region has a width of 1.6 μm and the end of the taper area 48a forms 0.6 μm wide dielectric pattern 50. The exposed regions of the p-InP layer 49, the upper active waveguide layer 48 and the n-InP space layer 47 through an HBr wet etching process using the dielectric pattern 50 as a mask are removed. Here, the upper active waveguide region can be adjusted to 1 μm wide and the end of the taper area 48a to 0 μm, using undercut generated by the lateral etching.

Figure 4E:
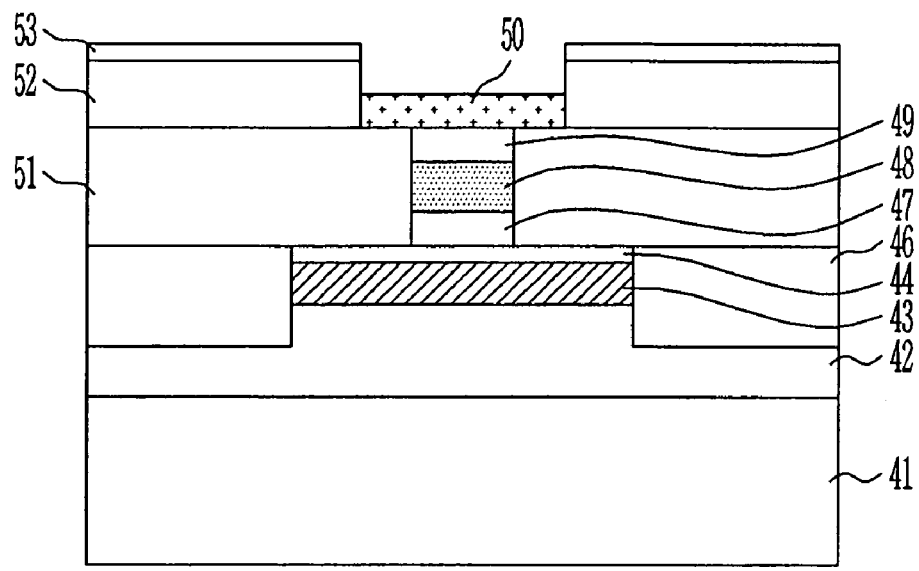

Referring to FIG. 4E, a p-InP current blocking layer 51 is grown on the removed portion of the p-InP layer 49, the upper active waveguide layer 48 and the n-InP space layer 47, and then an n-InP current blocking layer 52 and a thin p-InP layer 53 are grown on the exposed p-InP current blocking layer 51 excluding the portion of the dielectric pattern 50.

Figure 4F:
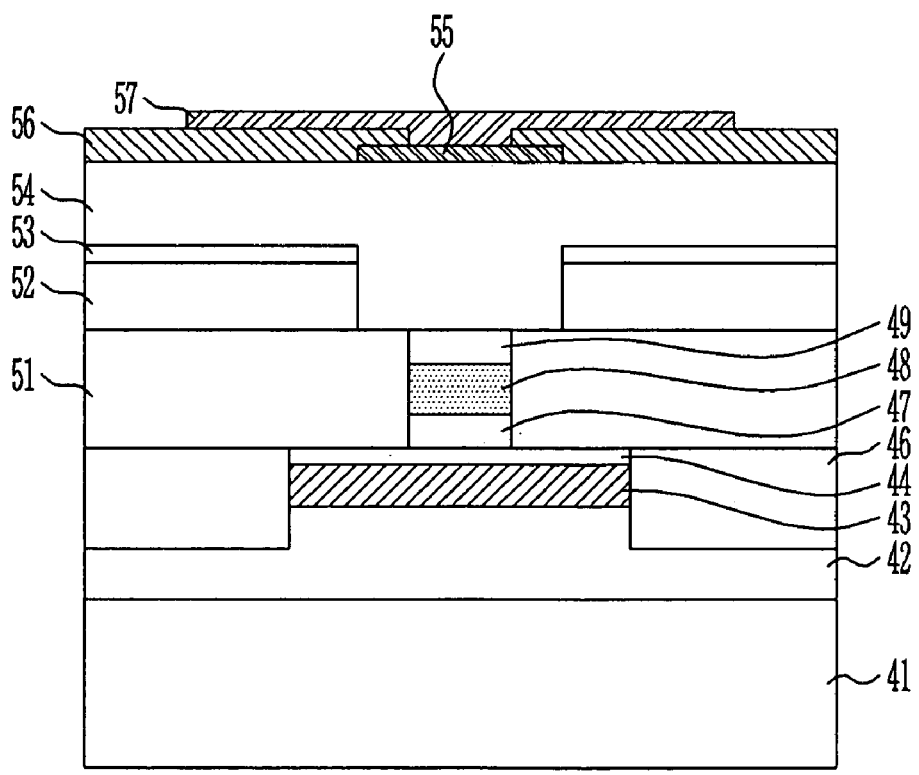

Referring to FIG. 4F, the dielectric pattern 50 is removed, and a p-InP cladding layer 54 is formed on the overall surface, and then, a p-InGaAs ohmic layer 55 is formed on a p-InP cladding layer 54 for preventing the diffusion of the injected current. After forming a silicon nitride layer 56 on the overall surface, a predetermined area of the p-InGaAs ohmic layer 55 are patterned to be exposed, and a p-type metal electrode 57 is formed on the silicon nitride 56 including the p-InGaAs ohmic layer 55. An n-type electrode (not shown) is formed under the substrate 41, and a section of the semiconductor optical amplifier is coated with a TiO$_2$/SiO$_2$ anti-reflection layer so that the reflectivity at the exit plane is reduced.

The growth process in the above embodiments employs a metal-organic chemical vapor deposition (MOCVD) method, and forms a series of gratings in the underlying passive waveguide and the upper active waveguide to generate the internal resonance, thereby fixing the gain of the semiconductor optical amplifier.

Figure 5A:
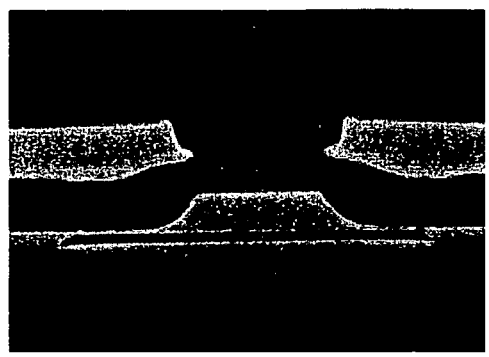
FIGS. 5A to 5C are SEM pictures showing a cross section of a semiconductor optical amplifier according to the present invention.
Figure 5B:
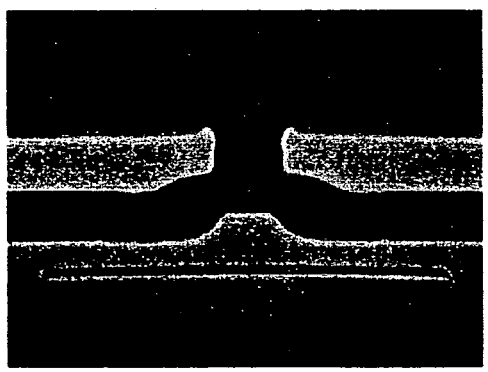
Figure 5C:
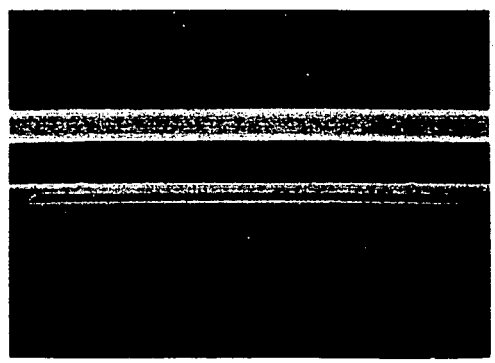

FIGS. 5A to 5C are SEM pictures showing cross sections of a semiconductor optical amplifier manufactured according to the present invention, wherein FIG. 5A shows a cross section taken along A11–A12 portion of FIG. 3, in which the active layer is included, FIG. 5B shows a cross section taken along B11–B12 portion of FIG. 3, the end of the taper area, and FIG. 5C shows a cross section taken along C11–C12 portion of FIG. 3, the end of the exit plane.

Figure 6:
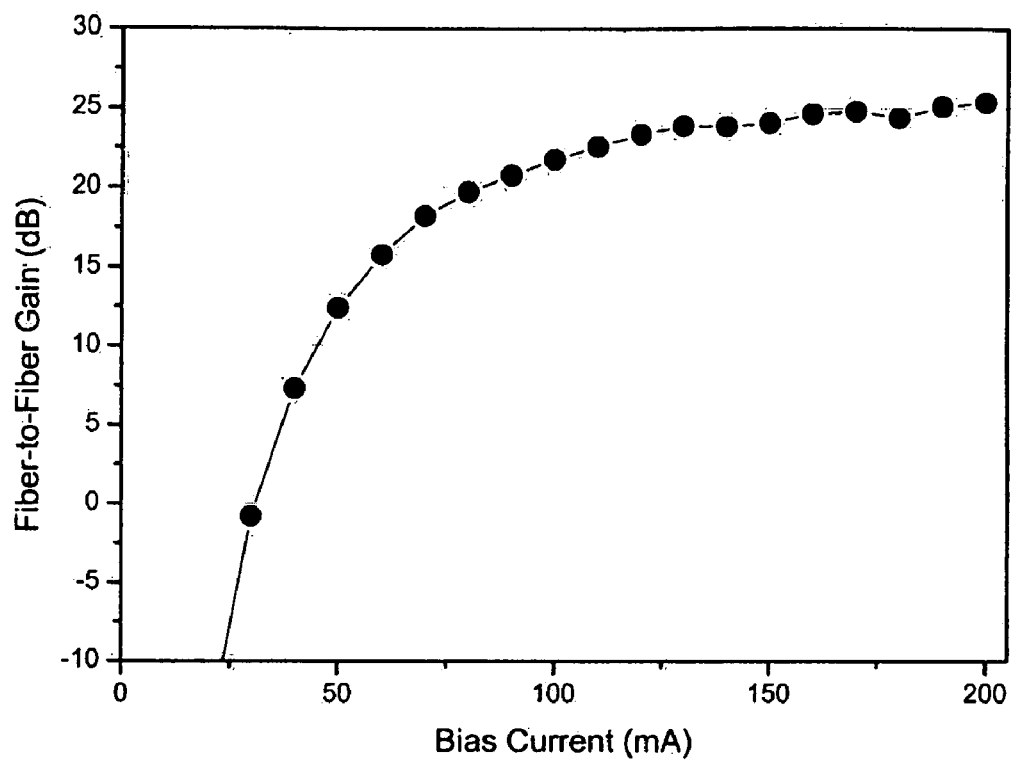
FIG. 6 is a graph showing gain characteristics for an optical fiber of a semiconductor optical amplifier according to the present invention.

FIG. 6 is a graph showing gain characteristics for an optical fiber, wherein the wavelength λ of the injection signal is 1.55 μm, and the incident signal intensity $P_{in}$ is −20 dBm.

Figure 7:
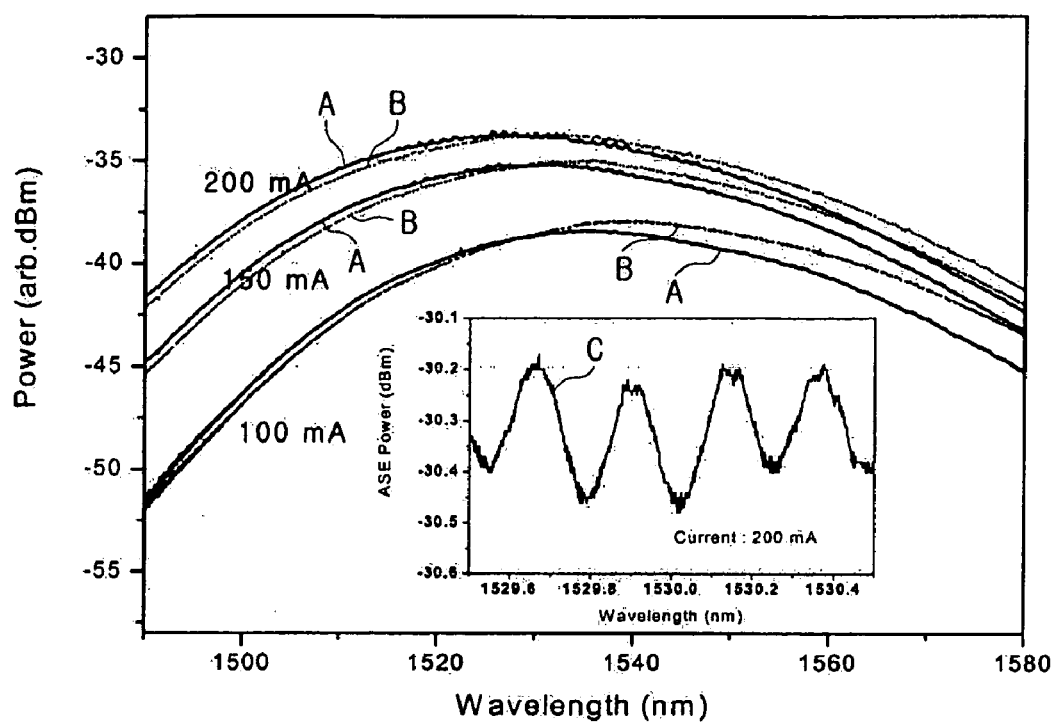
FIG. 7 is a graph showing amplified spontaneous emission (ASE) spectra for a TE and a TM mode of a semiconductor optical amplifier according to the present invention.

FIG. 7 is a graph showing amplified spontaneous emission (ASE) spectra for TE and TM modes with regard to the injected current, where the line A indicates the TE mode, the line B indicates the TM mode, and the line C indicates the ASC ripple at the peak wavelength of the ASE.

Figure 8:
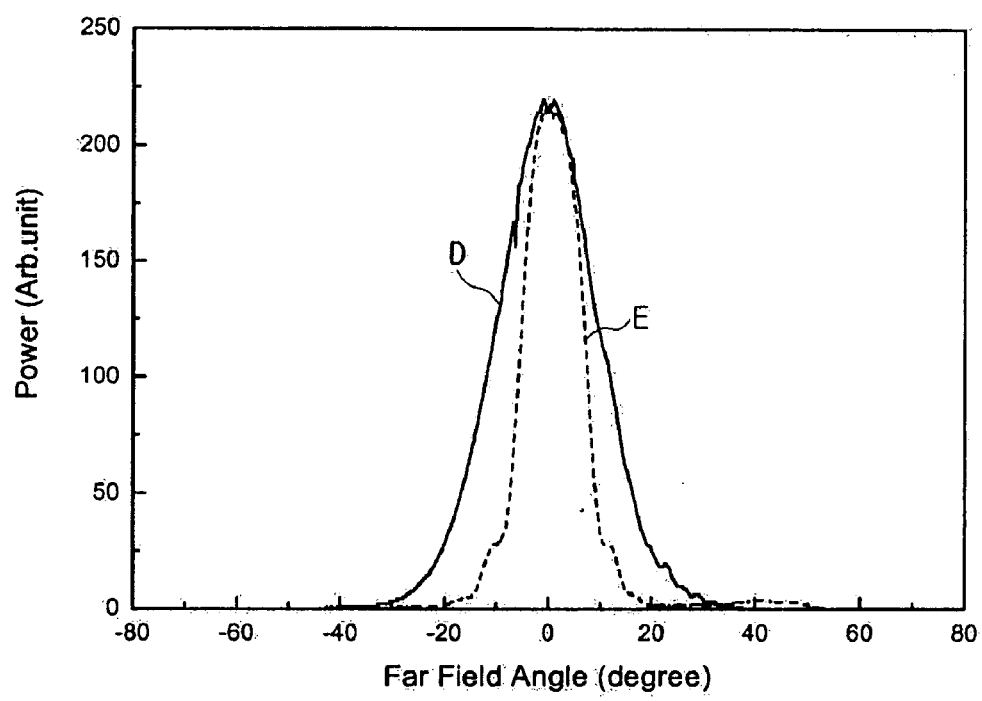
FIG. 8 is a graph showing a Far Field Pattern curve of a semiconductor optical amplifier according to the present invention.

FIG. 8 is a graph showing a Far Field Pattern curve of a semiconductor optical amplifier manufactured according to the present invention, where the line D indicates a vertical one and the line E indicates a horizontal one.

Figure 9:
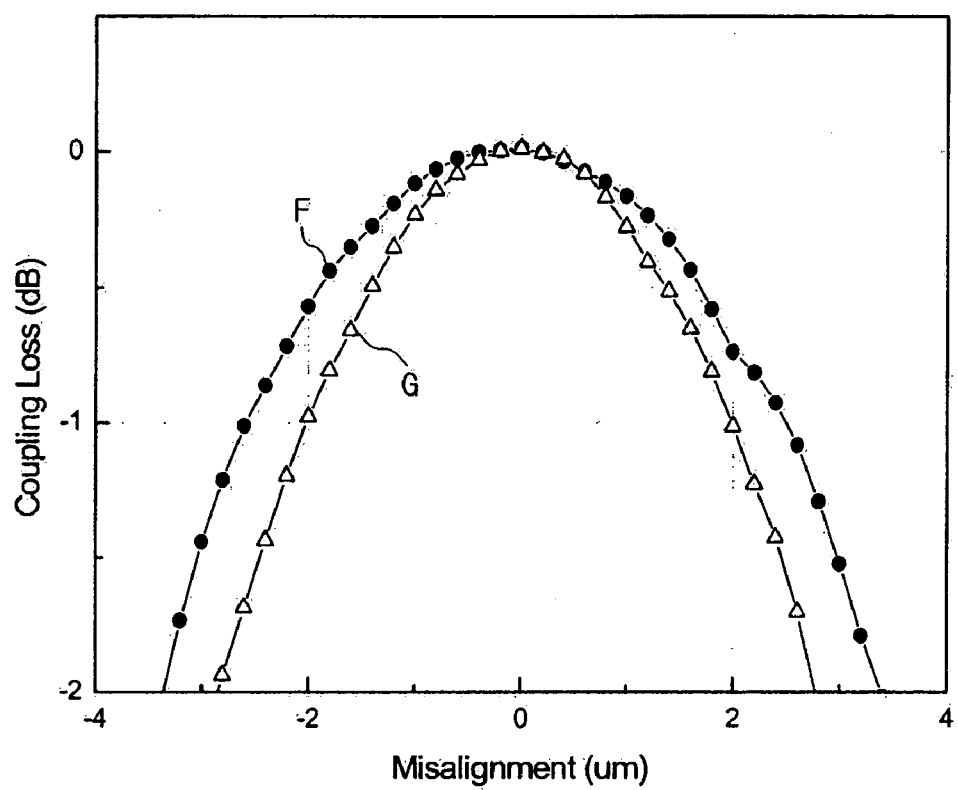
FIG. 9 is a graph showing an optical alignment tolerance of a semiconductor optical amplifier according to the present invention.

FIG. 9 is a graph showing an optical alignment tolerance of a semiconductor optical amplifier manufactured according to the present invention, where the line F indicates a horizontal one and the line G indicates a vertical one.

A variety of substitution, change and the modifications can be made without departing from the idea of the present invention by those skilled in the art will, so that it will be appreciated that the present invention as described above is not limited to the above embodiments and attached drawings.

As described above, the present invention performs the etching process for forming the underlying passive waveguide, and then grows the n-InP planarization layer on the etched region, thereby removing the step of the surface. Therefore, the characteristics of the active layer are not degraded or changed due to the stress caused by the step of the surface in forming the upper waveguide, so that the light coupling efficiency with the optical fiber is enhanced. Further, the present invention makes the planar buried heterostructure easily implemented with the current blocking layer, thereby uniformly maintaining the device characteristics and improving the injection current characteristics.

What is claimed is:

1. A method for manufacturing a planar buried semiconductor optical amplifier, the method comprising the steps of:

after growing a lower cladding layer, a lower waveguide layer and an upper cladding layer on a substrate, patterning some thickness of the lower cladding layer, the lower waveguide layer and the upper cladding layer through an etching process using a dielectric layer pattern to form a lower waveguide;

growing a planarization layer on the etched portions of the lower cladding layer, the lower waveguide layer and the upper cladding layer to smooth a surface;

after removing the dielectric layer pattern, growing a space layer, an upper waveguide layer and a first cladding layer on the overall upper surface;

patterning the first cladding layer, the upper waveguide layer and the space layer through the etching process using the dielectric layer pattern to form an upper waveguide having a horizontal taper area;

after growing a first current blocking layer on the etched portions of the first cladding layer, the upper waveguide layer and the space layer of the upper waveguide, growing a second current blocking layer on the exposed portion of the first current block layer excluding the dielectric layer pattern; and after removing the dielectric layer pattern, forming a second cladding layer on the overall upper surface, and forming an electrode on the second cladding layer and the substrate, respectively.

2. The method for manufacturing the planar buried semiconductor optical amplifier according to claim 1, wherein the etching process for forming the lower waveguide is performed by a wet etching process using an HBr-based etchant, and is performed such that some thickness of the upper cladding layer, the lower waveguide layer and the lower cladding layer below the dielectric layer pattern is side-etched.

3. The method for manufacturing the planar buried semiconductor optical amplifier according to claim 1, wherein the planarization layer is an n-InP layer.

4. The method for manufacturing the planar buried semiconductor optical amplifier according to claim 1, wherein the first current blocking layer is a p-InP layer, and the second current blocking layer is an n-InP layer.

5. The method for manufacturing the planar buried semiconductor optical amplifier according to claim 1, further comprising the step of:

forming a p-InP layer on the second current blocking layer.

6. The method for manufacturing the planar buried semiconductor optical amplifier according to claim 1, wherein the first and second cladding layers are p-InP layers.

7. The method for manufacturing the planar buried semiconductor optical amplifier according to claim 1, further comprising the step of:

before forming the electrode, forming an ohmic layer on the second cladding layer.

* * * * *